United States Patent [19]

Laton

[11] Patent Number: 4,470,021
[45] Date of Patent: Sep. 4, 1984

[54] POWER COMBINER FOR COAXIAL DIODE OSCILLATORS

[75] Inventor: Richard W. Laton, Lexington, Mass.

[73] Assignee: Raytheon Company, Lexington, Mass.

[21] Appl. No.: 408,586

[22] Filed: Aug. 17, 1982

[51] Int. Cl.³ .............................................. H03B 7/14
[52] U.S. Cl. ..................................... 331/56; 331/101; 331/107 P; 331/107 C
[58] Field of Search ........... 331/56, 96, 107 P, 107 C, 331/101

[56] References Cited

U.S. PATENT DOCUMENTS

| 3,931,587 | 1/1976 | Harp et al. | 331/56 |
| 4,075,578 | 2/1978 | Dydyk | 331/56 |
| 4,189,684 | 2/1980 | Hieber et al. | 331/56 |

Primary Examiner—Siegfried H. Grimm
Attorney, Agent, or Firm—Philip J. McFarland; Joseph D. Pannone

[57] ABSTRACT

A power combiner using a circularly cylindrical cavity, dimensioned to support the $TM_{020}$ mode, to combine the power from coaxial diode oscillators is shown to comprise: (a) a first plurality of such oscillators disposed about the periphery of such cavity; (b) a second plurality of such oscillators disposed in coincidence with the first spatial null in the electric field in such cavity; and (c) a plurality, similar in number to the second plurality of such oscillators, of electrically conductive bridges interposed between the top and bottom walls of the cavity in-between the center conductors of the coaxial diode oscillators in the second plurlaity of such oscillators.

2 Claims, 1 Drawing Figure

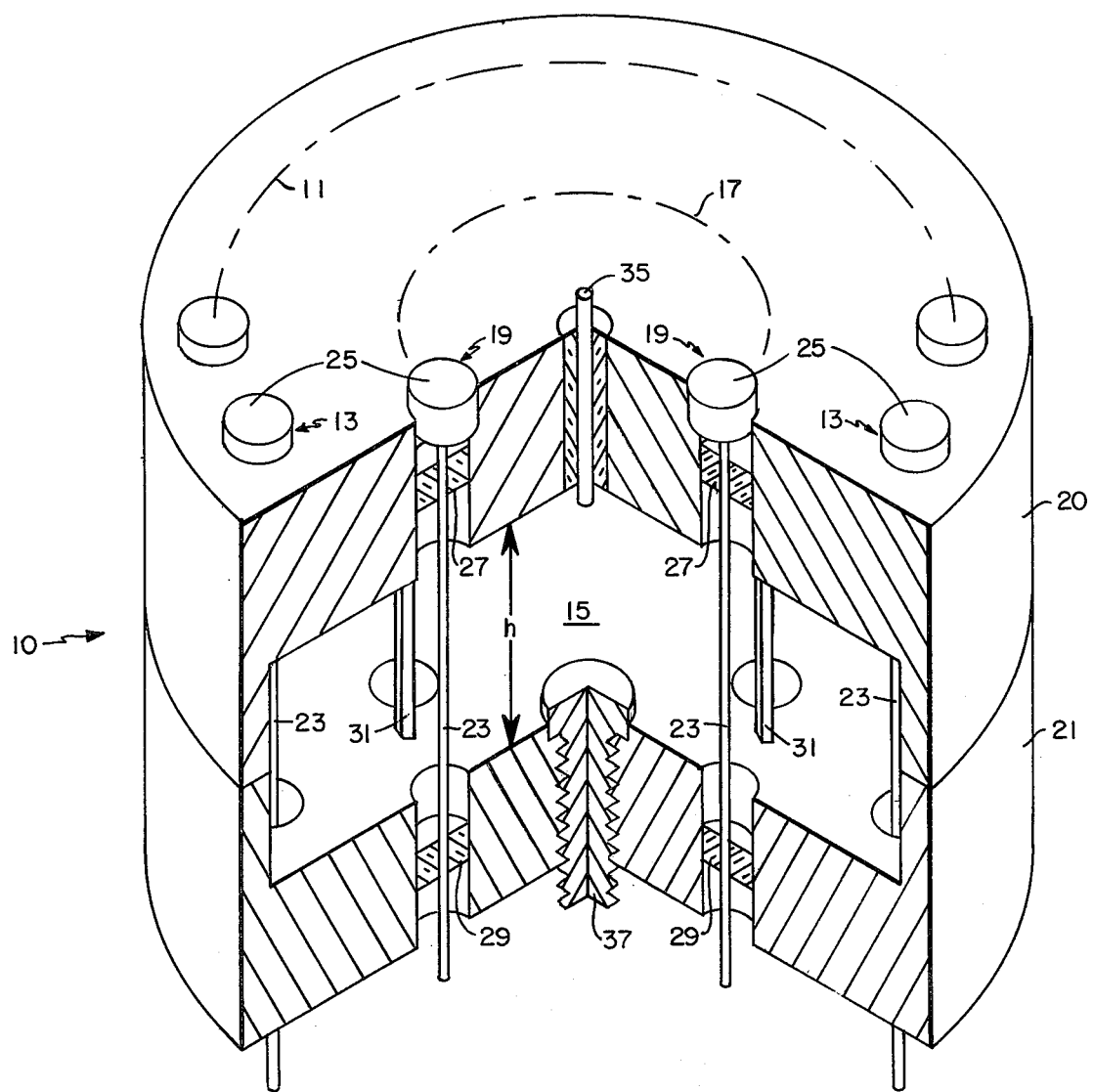

POWER COMBINER FOR COAXIAL DIODE OSCILLATORS

BACKGROUND OF THE INVENTION

This invention pertains generally to power combiners for solid state devices, and particularly to a power combiner with concentric rings of coaxial diode oscillators.

It is known in the art (see U.S. Pat. No. 3,931,587) that a microwave power source may be formed by providing a circularly cylindrical cavity wherein outputs of a plurality of coaxial diode oscillators may be combined in a proper phasic relationship. In the source illustrated in the just-cited patent, diode oscillators are symmetrically disposed on the periphery of a circularly cylindrical cavity dimensioned to operate in the $TM_{010}$ mode. The number of coaxial diode oscillators that may be so disposed is limited by the length of such periphery, with the result that the amount of microwave power out of such a combiner is similarly limited. It is also known in the art (see U.S. Pat. No. 4,189,684) that if the length of the periphery of a cylindrical cavity were to be increased so that the $TM_{020}$ mode could be supported in such a cavity, the power out of a greater number of coaxial diode oscillators may be combined to increase microwave power out of a microwave power source. However, to avoid the occurrence of unwanted modes with attendant instability, it is necessary to provide mode suppressors. Any known type of mode suppressor absorbs microwave power that otherwise could contribute to the power out of the microwave power source.

SUMMARY OF THE INVENTION

With the foregoing background of the invention in mind, it is a primary object of this invention to provide a microwave power combiner using a circularly cylindrical cavity operating in the $TM_{020}$ mode with a maximum number of coaxial oscillators.

The foregoing and other objects of the invention are attained by providing a microwave power source comprising a circularly cylindrical cavity, dimensioned to support the $TM_{020}$ mode and to suppress any TE modes, with an inner and an outer ring of coaxial diode oscillators disposed respectively at the inner and outer nulls in the electric field in such cavity so that: (a) each different one of such oscillators is magnetically coupled to such cavity; (b) the phase of the output of each one of such oscillators is determined by such cavity; and (c) all undesired TM modes are inhibited from existing in such cavity by the presence of such oscillators.

BRIEF DESCRIPTION OF THE DRAWINGS

Other objects and many of the attendant advantages of the invention will be readily appreciated as the same becomes better understood by reference to the following detailed description when considered in connection with the accompanying drawings wherein the single FIGURE is an isometric view, partially cut away and simplified, of a power combiner according to this invention.

DESCRIPTION OF THE PREFERRED EMBODIMENT

Before proceeding with a detailed description of the contemplated power combiner it is noted here in passing that, for the sake of simplicity, only elements necessary to an understanding of the invention have been illustrated. Other ancillary elements provided with a working power combiner incorporating the invention, for example, mounting hardware, power supplies for the coaxial diode oscillators and connections to an output load have not been shown because such unillustrated elements may be easily provided by one of ordinary skill in the art. Further, the construction and operation of each one of the coaxial diode oscillators here contemplated to be used are described in detail in U.S. Pat. Nos. 3,931,587 and 4,189,684.

Referring now to the single FIGURE, it may be seen that a power combiner 10 according to this invention includes an outer ring 11 of coaxial diode oscillators 13 disposed along the periphery of a cavity 15 (here a circularly cylindrical cavity) and an inner ring 17 of coaxial diode oscillators 19. Such inner ring is coincident with the first spatial null of the electric field (not shown) with the cavity 15. It will be appreciated that where the electric field goes through a spatial null the magnetic field (not shown) is at a maximum. It will be evident that, with the cavity 15 operating in the $TM_{020}$ mode, the electric field at the periphery of such cavity is also at a null and that the magnetic field there is correspondingly at a maximum.

The coaxial diode oscillators 13 making up the outer ring 11 are constructed and mounted in a known manner. Thus, holes (not numbered) are formed through the upper and lower covers (20, 21) to accommodate coaxial diode oscillators spaced along with outer ring 11. The adjacent sidewalls (not numbered) then are effective to maintain a transverse electric magnetic (TEM) field around the center conductor 23 of each such oscillator between the diode 25 (here an IMPATT diode), the matching section and load (not shown). In consequence, the magnetic field around each one of the diode oscillators is coupled to the magnetic field within the cavity 15. A different situation obtains with each one of the coaxial diode oscillators 19 (made up of diode 25, center conductor 23, matching section 27 and load 29) in the inner ring 17. In each one of such oscillators, structure in the cavity 15 adjacent to the center conductor is required to support the TEM mode. To supply such structure, an electrically conductive bridge 31 is disposed as shown between adjacent coaxial diode oscillators 19 in the inner ring 17. Completing the combiner 10 are an E-plane probe 35 for coupling out the R.F. power from the cavity 15 and a tuning plunger 37 for controlling the resonant frequency of the cavity 15.

It will not be appreciated that the plurality of electrically conductive bridges 31 together with the plurality of center conductors 23 in the inner ring 17 constitute a short circuit within the cavity 11 to prevent that element from supporting any $TM_{ONO}$ mode (where N is an odd integer). Further, it will be appreciated that, by limiting the height "h" of the cavity 11 to less than one-half wavelength, such cavity will be unable to support any TE modes.

Having described a preferred embodiment of this invention, it will now be apparent to those of skill in the art that many changes may be made without departing from the inventive concepts. It is felt, therefore, that coverage should not be limited to the disclosed embodiment, but rather should be limited only by the spirit and scope of the appended claims.

What is claimed is:

1. In a power combiner for microwave energy produced by coaxial diode oscillators operating in the TEM mode, said combiner including a circularly cylindrical cavity having opposing end walls and dimensioned to support the $TM_{020}$ mode at a desired frequency of operation, a first plurality of said oscillators magnetically coupled to said cavity around the periphery thereof where the electric field is at a null and a second plurality of said oscillators magnetically coupled to said cavity around a ring coincident with the first spatial null of the electric field, the improvement comprising a plurality, similar in number to the second plurality of coaxial diode oscillators, of electrically conductive bridges interposed between the coaxial diode oscillators in said second plurality thereof and connected between the opposing end walls of the circularly cylindrical cavity.

2. The power combiner as in claim 1 wherein the distance between the opposing end walls of the circularly cylindrical cavity is less than one-half wavelength at the operating frequency of said cavity.

* * * * *